United States Patent [19]

Sundstrom

[11] Patent Number: 5,434,523
[45] Date of Patent: Jul. 18, 1995

[54] CIRCUIT AND METHOD FOR ADJUSTING A PULSE WIDTH OF A SIGNAL

[75] Inventor: Ray D. Sundstrom, Chandler, Ariz.

[73] Assignee: Motorola, Inc., Schaumburg, Ill.

[21] Appl. No.: 223,186

[22] Filed: Apr. 5, 1994

[51] Int. Cl.$^6$ .............................................. H03K 3/017
[52] U.S. Cl. .................................. 327/172; 327/237; 327/246; 327/276; 327/280
[58] Field of Search ............... 307/262, 265, 267, 268, 307/529, 590, 591, 592, 593, 603, 608; 328/34, 55, 56, 58, 185; 327/172–175, 231, 237, 246, 250, 261, 264, 266, 270, 392, 395

[56] References Cited

U.S. PATENT DOCUMENTS

| | | |
|---|---|---|
| 3,586,985 | 6/1971 | Schoendorff ..................... 328/61 |
| 3,675,133 | 7/1972 | Frankeny et al. ................. 328/55 |
| 4,797,586 | 1/1989 | Traa ................................ 307/603 |

Primary Examiner—Timothy P. Callahan
Assistant Examiner—Jeffrey Zweizig
Attorney, Agent, or Firm—Rennie William Dover

[57] ABSTRACT

The present invention provides an output signal whose pulse width may be adjusted with respect to the pulse width of an incoming input signal. In particular, a plurality of signals is generated in response to the input signal. One of the plurality of signals is selected for controlling when the output signal transitions from a first logic state to a second logic state, and one of the plurality of signals is selected for controlling when the output signal transitions from a second logic state to a first logic state wherein the output signal has a pulse width being a function of the selection of the plurality of signals.

4 Claims, 5 Drawing Sheets

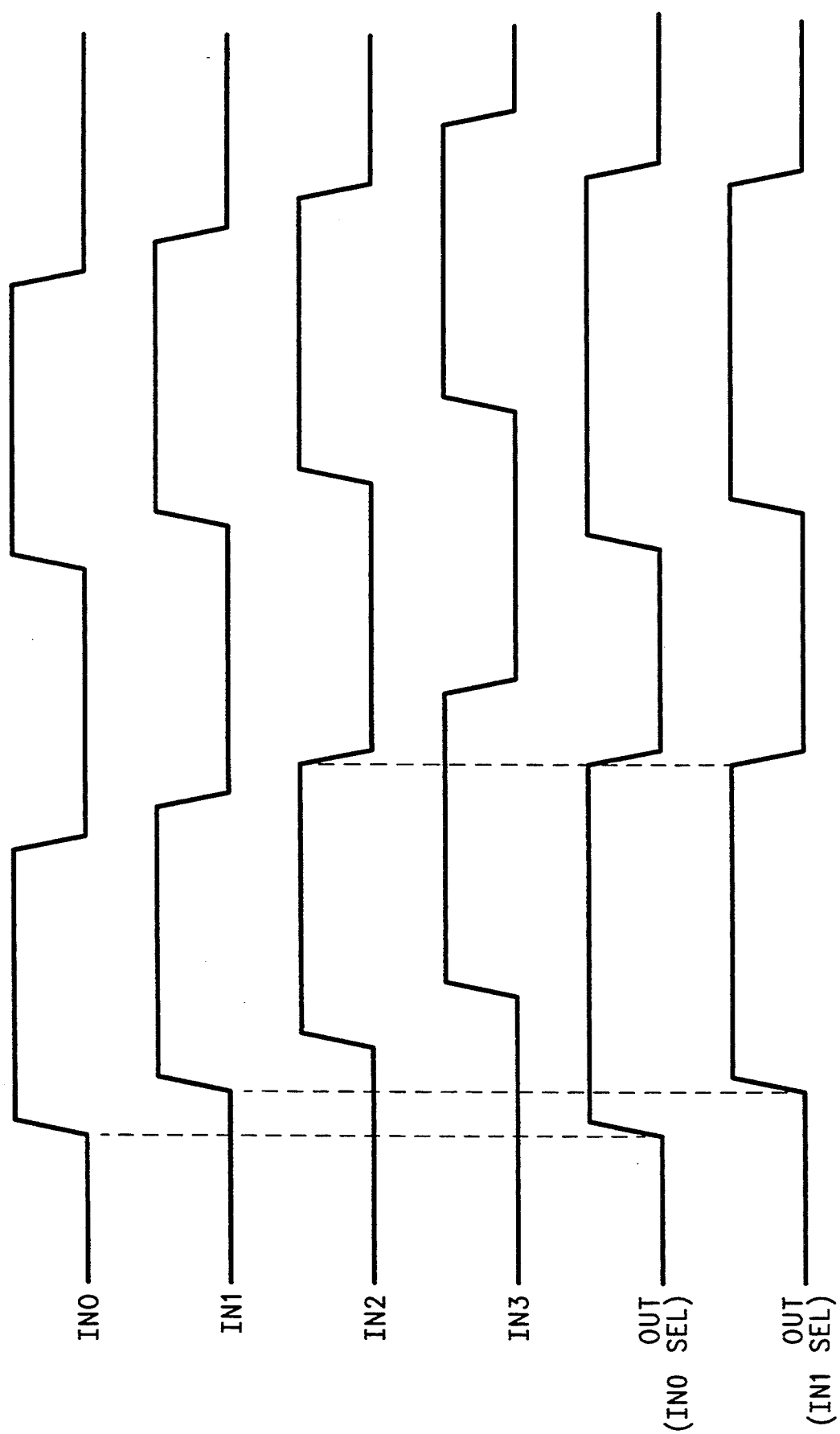

CIRCUIT AND METHOD FOR ADJUSTING A PULSE WIDTH OF A SIGNAL

BACKGROUND OF THE INVENTION

The present invention relates in general to optical data transmission and, more particularly, to optimizing electronic data waveforms for optical transmission prior to their conversion to optical signals.

It is known in the art that in transmitting high speed optical signals, both laser devices and light emitting diodes are not balanced in their "turn-on" and "turn-off" characteristics. Consequently, a signal transmitted over a fiber optic medium is unbalanced in that the resultant duty cycle will be more or less than 50 percent. Electronic circuits implemented in integrated circuit semiconductor technologies, such as bipolar emitter-coupled logic and gallium arsenide MOS, have demonstrated capabilities for operating at frequency ranges of 600 megahertz to several gigahertz. Coupling these high performance circuits to drive optical devices, that in turn drive fiber optic cables, results in less than ideal optic system performance due to the unbalanced duty cycle presented to the optical medium. Therefore, the advantages of using a high frequency semiconductor technology front-end is negated at the back-end fiber optic interface.

In the past, attempts to remedy this problem have included the addition of compensating resistor/capacitor networks to the outputs of the circuits that drive the optical devices. These networks are custom designed for a specific system operating frequency and for the operating characteristic of the light emitting source. As a result, the range of applications is very narrowly limited, and the same circuit must be redesigned for varying transmitting devices and mediums.

Hence, a need exists for a universal apparatus and method for producing variable electronic driving signals for optical devices that compensate for the mismatch in "turn-on" and "turn-off" characteristics of the optical devices and thus provide an optimized transmitted optical signal.

SUMMARY OF THE INVENTION

Briefly stated, the present invention is a method for adjusting a pulse width of an input signal and a circuit for adjusting the pulse width of the input signal. The method includes the steps of receiving a pulse width adjust enable signal, receiving an input signal, generating a plurality of signals in response to the input signal, selecting one of the plurality of signals for controlling when an output signal transitions from a first logic state to a second logic state, and selecting one of the plurality of signals for controlling when the output signal transitions from the second logic state to the first logic state, wherein the output signal has a pulse width that is a function of the plurality of signals and the pulse width adjust enable signal when the pulse width adjust enable signal is in one logic state, and wherein the pulse width of the output signal is substantially the same as a pulse width of the input signal when the at least one select signal is in another logic state.

In another aspect, the present invention includes a circuit for adjusting a pulse width of an input signal that comprises a plurality of serially coupled delay circuits for providing a plurality of delayed signals, wherein an input of a first one of the plurality of delay circuits is coupled for receiving the input signal, a level shift circuit having an input responsive to a delayed signal of a last one of the plurality of serially coupled delay circuits, the level shift circuit providing a level shift signal, and a pulse width adjuster circuit responsive to a plurality of select signals and having a plurality of inputs coupled for receiving the plurality of delayed signals and the level shift signal, the pulse width adjuster circuit providing an output signal whose pulse width is a function of the plurality of delayed signals and the plurality of select signals.

BRIEF DESCRIPTION OF THE DRAWINGS

FIG. 5 is a graphical diagram illustrating various signals associated with the circuits of FIGS. 3 and 4.

DETAILED DESCRIPTION OF THE PREFERRED EMBODIMENT(S)

Figure 1:
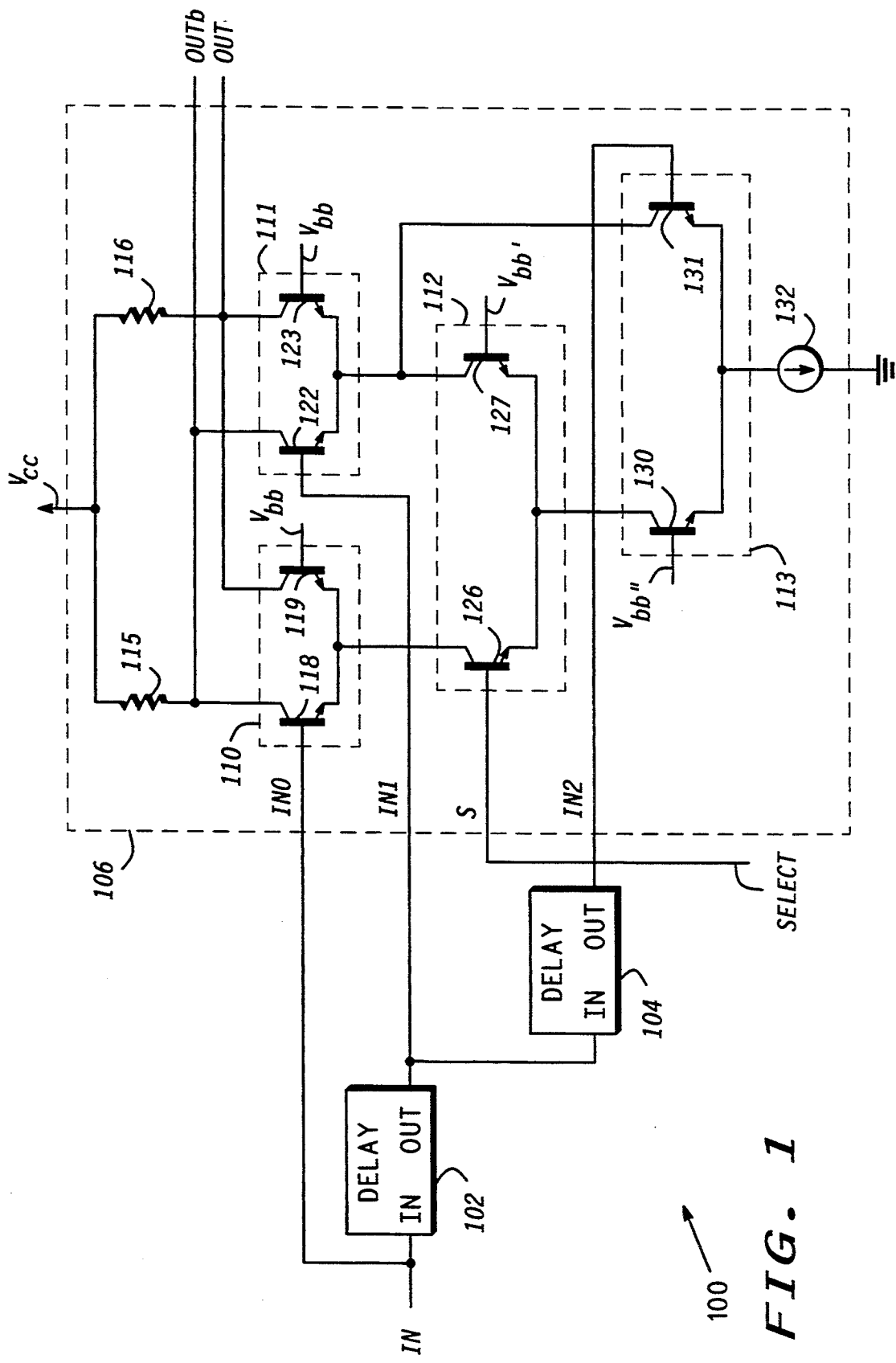
FIG. 1 is a detailed schematic/block diagram of a first embodiment of a circuit for adjusting a pulse width of a signal in accordance with the present invention.

Referring to FIG. 1, there is illustrated a detailed schematic/block diagram of circuit 100 for adjusting the pulse width of input signal IN and for providing output signals OUT and OUTb. Circuit 100 includes delay circuit 102 having an input coupled to receive input signal IN and an output coupled to an input of delay circuit 104. In response to signal IN, circuit 100 generates a plurality of delayed signals that are applied to inputs IN0, IN1 and IN2 of pulse width adjuster circuit 106 wherein it is understood that signal IN which is applied to the IN0 input of circuit 106 is considered one of the delayed signals with delay substantially equal to zero. Moreover, the outputs of delay circuits 102 and 104 are respectively coupled to inputs IN1 and IN2 of circuit 106. Additionally, circuit 106 has a select input (S) coupled to receive select signal SELECT.

Pulse width adjuster circuit 106 includes a first level of switching which includes switches 110 and 111 for switching about a first bias voltage $V_{bb}$. Circuit 106 also includes switch 112 for switching about a second reference voltage $V_{bb'}$ wherein $V_{bb'}$ is substantially one base emitter voltage below bias voltage $V_{bb}$. Additionally, circuit 106 includes switch 113 having an input responsive to an output signal appearing at the output of delay circuit 104 for switching about a third bias voltage $V_{bb''}$ wherein $V_{bb''}$ is substantially one base emitter voltage below bias voltage $V_{bb'}$.

Pulse width adjuster circuit 106 also includes load resistors 115 and 116 coupled to switches 110 and 111. It is worth noting that although loads 115 and 116 are shown as resistors, it is understood that loads 115 and 116 may take the form of an active device having its controlled electrode coupled to one of its current carrying electrodes.

In more detail, switch 110 includes emitter coupled transistors 118 and 119 wherein the base of transistor 118 is coupled to the IN0 input of circuit 106 for receiving input signal IN. The base of transistor 119 is coupled to receive first bias voltage $V_{bb}$. The collector of transistor 118 is coupled to an inverting output of circuit 100 (OUTb) and through load resistor 115 to a first supply voltage terminal at which the operating potential $V_{CC}$ is applied. The collector of transistor 119 is coupled to a non inverting output of circuit 100 (OUT) and through load resistor 116 to the first supply voltage terminal.

Switch 111 includes emitter coupled transistors 122 and 123 wherein the base of transistor 122 is coupled to input IN1 of circuit 106 for receiving a signal appearing at the output of delay circuit 102. The collector of transistor 122 is coupled to the collector of transistor 118. The base of transistor 123 is coupled to receive bias voltage $V_{bb}$. The collector of transistor 123 is coupled to the collector of transistor 119.

Moving on to a second level of switching, switch 112 includes emitter coupled transistors 126 and 127 wherein the base of transistor 126 is coupled to the select input of pulse width adjuster circuit 106. The base of transistor 127 is coupled to receive second bias voltage $V_{bb''}$. The collector of transistor 126 is coupled to the emitters of transistors 118 and 119 while the collector of transistor 127 is coupled to the emitters of transistors 122 and 123.

Finally, moving down to a third level of switching, switch 113 includes emitter coupled transistors 130 and 131 wherein the base of transistor 130 is coupled to receive third bias voltage $V_{bb''}$ while the base of transistor 131 is coupled to the IN2 input of circuit 106 and for receiving an output signal appearing at the output of delay circuit 104. The collector of transistor 130 is coupled to the common emitters of transistors 126 and 127 while the collector of transistor 131 is coupled to the common emitters of transistors 122 and 123.

Finally, current source 132 is coupled between the common emitters of transistors 130 and 131 and a second supply voltage terminal at which ground reference is applied.

Figure 2:
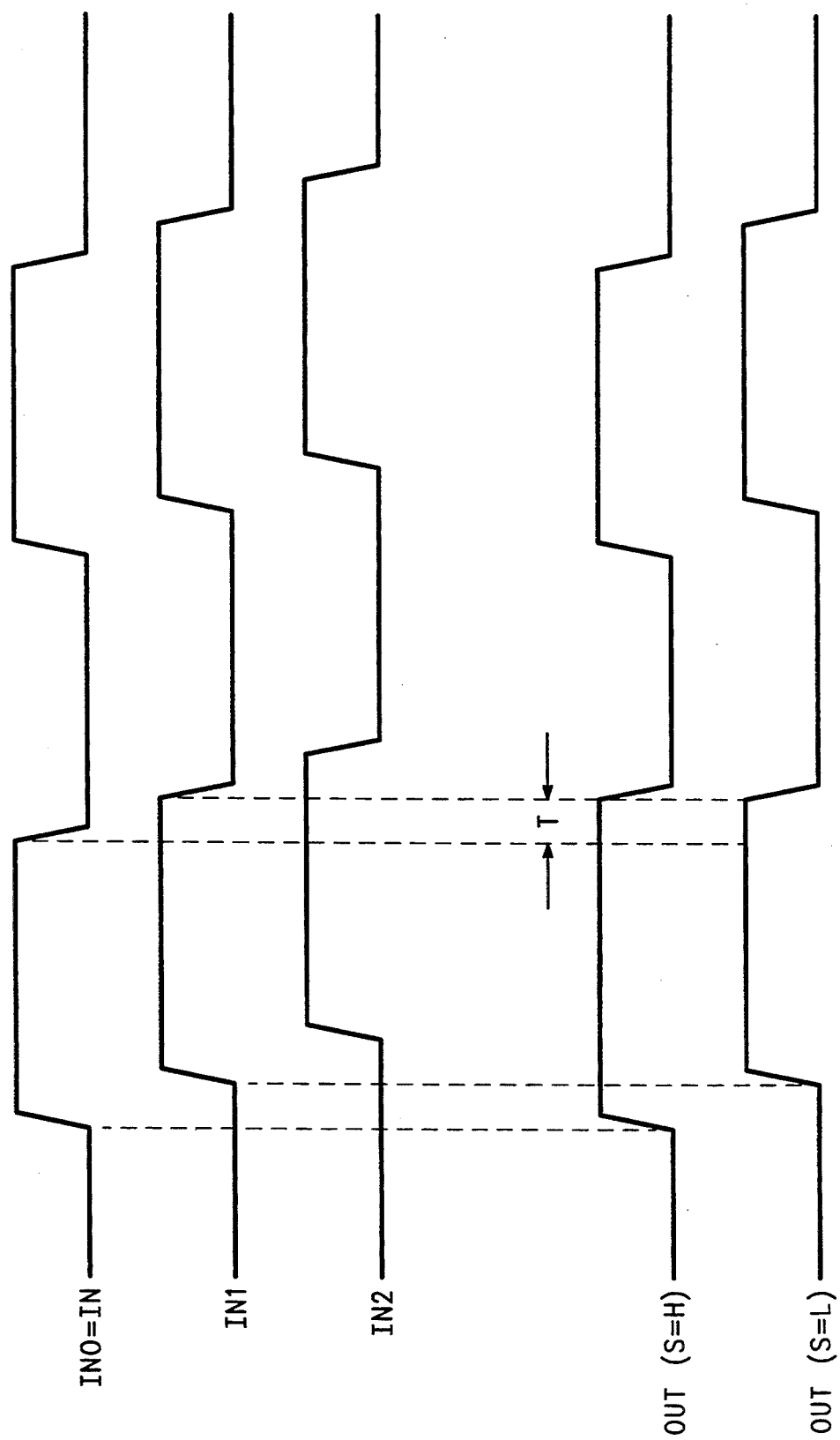
FIG. 2 is a graphical diagram illustrating various signals associated with the circuit of FIG. 1.

Referring to FIG. 2, there is illustrated a graphical diagram of various signals which will be utilized to explain the detailed operation of circuit 100 of FIG. 1. In particular, waveform IN0 represents the signal appearing at the IN0 input of circuit 106 as well as to the input of delay circuit 102 wherein waveform IN0 equivalently represents signal IN. Waveform IN1 represents the signal appearing at the output of delay circuit 102 and at the IN1 input of circuit 106. Waveform IN2 represents the signal appearing at the output of delay circuit 104 and at the IN2 input of circuit 106. Waveform OUT(S=H) represents the signal at the non-inverting output (OUT) of circuit 100 when signal SELECT is a logic high, while waveform OUT(S=L) represents the signal at the non-inverting output (OUT) of circuit 100 when signal SELECT is a logic low.

Circuit 100 provides a first output signal OUT(S=H) at non-inverting output OUT (and a corresponding inverting signal at inverting output OUTb) when signal SELECT is in a logic high state and a second output signal OUT(S=L) when signal SELECT is in a logic low state.

First, assume that signal SELECT is in a logic high state. When signal IN is low (signal IN is the signal applied to the IN0 input of circuit 106), current flows through resistor 116, and transistors 119, 126, 130, and through current source 132. This current flowing through resistor 116 makes a logic low level at the non-inverting output OUT. Since no current flows through resistor 115, the inverting output OUTb is pulled to a high logic level.

However, when signal IN switches high, current flow switches from transistor 119 and resistor 116 to transistor 118 and resistor 115. This switch of current causes OUT to go to a high state and OUTb to go to a low state. After a predetermined delay produced by delay circuit 102, the signal appearing at the IN1 input goes to a high state selecting transistor 122 to be the current carrying device in switch 111 when the current is diverted through switch 111. Moreover, after another predetermined delay produced by delay circuit 104, the signal appearing at the IN2 input goes high, switching current from transistors 118, 126, and 130 to transistors 122 and 131. Since the collectors of transistor 118 and 122 are connected together, the current continues to flow through resistor 115, and OUT remains at a logic high and OUTb remains at a logic low.

When signal IN switches low, transistor 119 is selected as the current carrying device of switch 110 when current is diverted through this switch. After delay 102, a logic low appears at the IN1 input of circuit 106 thereby switching current from resistor 115 and transistor 122 to resistor 116 and transistor 123. This causes OUT to go low and OUTb to go high. After delay 104, current switches from transistors 123 and 131 to transistors 119, 126, and 130. Since collectors 123 and 119 are connected together the current continues to flow through resistor 116, and OUT remains at a logic low and OUTb remains at a logic high.

The result is the production of a signal appearing at non-inverting output OUT that goes high when the signal appearing at input IN0 goes high, and goes low when the signal appearing at IN1 goes low thereby stretching the pulse width of input signal IN by the predetermined delay provided by delay circuit 102. In particular, referring to FIG. 2, signal OUT(S=H) has a longer pulse width than signal IN by a time of T where T represesents the delay provided by delay circuit 102. Note that the switching of ouptus OUT and OUTb occur only at the top level switches 110 and 111. This top level switching is important, since it is faster than switches occuring at the lower levels. The lower level switches divert current, but are never responsible for the actual switching of the outputs.

Now, assume that signal SELECT is in a logic low state. In this condition, transistor 127 is the current carrying device of switch 112, so switch 111 is always in control of the outputs. When the signal appearing at input IN2 is low, current flows through switch 111 and transistors 127 and 130. When the signal appearing at input IN2 is high, current flows through switch 111 and transistor 131. The result is that the signal appearing at OUT will follow the signal appearing at input IN1 so the pulse width of the signal appearing at output (OUT) has substantially the same pulse width of the input signal IN as shown in FIG. 2 by signal OUT(S=L).

In summary, the above described circuit and method provides an output signal at OUT (and its inversion at OUTb) whose pulse width may be (i) stretched (or equivalently, its duty cycle changed) with respect to incoming signal IN by the amount of delay in delay circuit 102, or (ii) maintained with respect to incoming signal IN, depending upon the logic state of signal SELECT.

Figure 3:
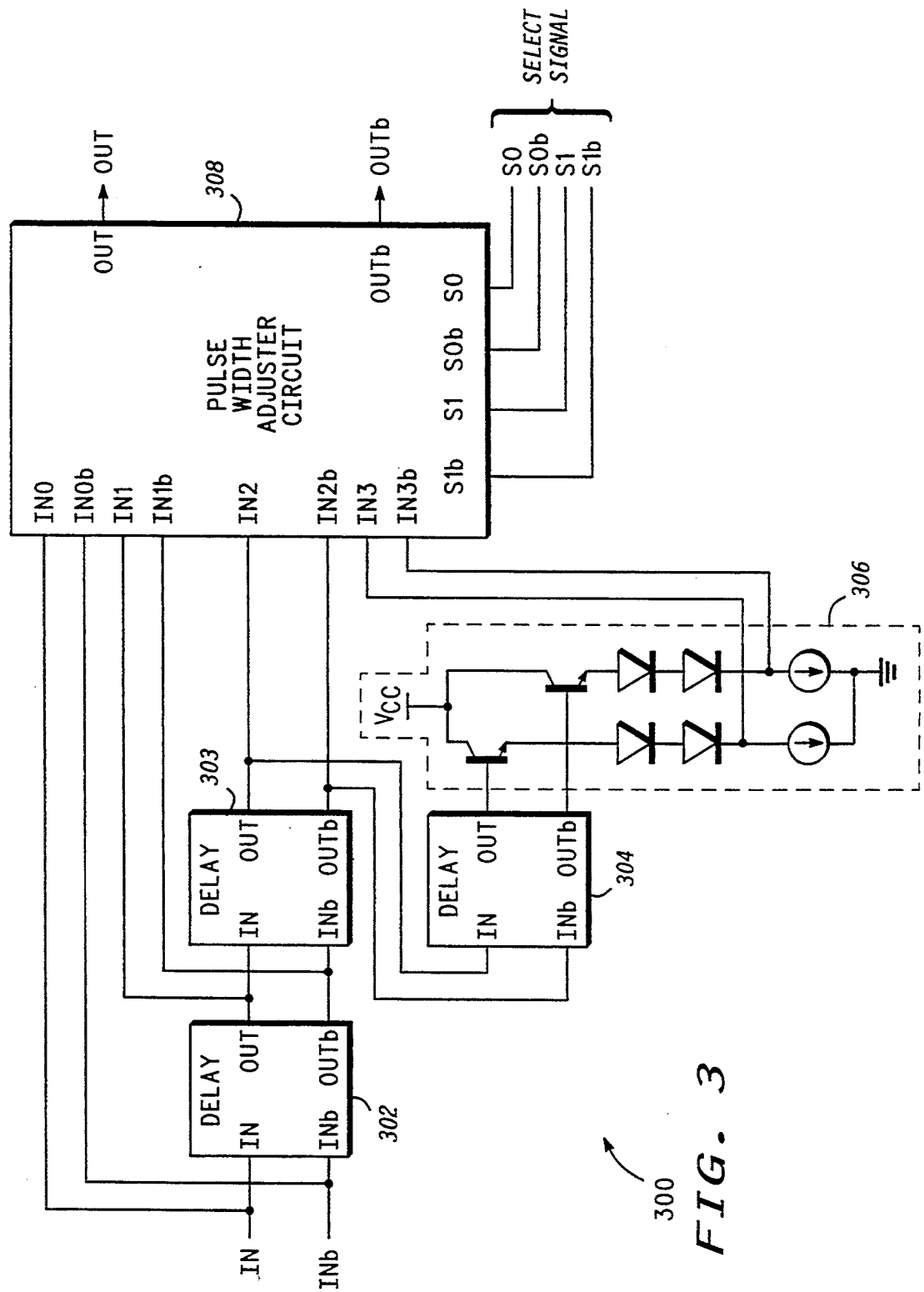
FIG. 3 is a detailed schematic/block diagram of a second embodiment of a circuit for adjusting a pulse width of a signal in accordance with the present invention.

Referring to FIG. 3, there is illustrated circuit 300 for adjusting the pulse width of differential input signal (IN, INb) and for providing differential output signals (OUT and OUTb). Circuit 300 includes serially coupled delay circuits 302, 303 and 304 wherein the differential outputs of a previous delay circuit is coupled to the differential inputs of a succeeding delay circuit. For example, the differential outputs of delay circuit 302 is coupled to the differential inputs of the succeeding delay circuit 303. Moreover, the input of the first delay circuit 302 is coupled to receive differential input signal IN and INb. Also, the differential outputs of the last serially coupled delay circuit 304 is coupled to first and second inputs of level shift circuit 306.

Similar to circuit 100 of FIG. 1, circuit 300 generates a plurality of delayed signals in response to signals IN and INb wherein signals IN and INb are considered one of the plurality of delayed signals with a delay substantially equal to zero. In particular, differential input signals IN and INb are respectively coupled to a first differential input (IN0 and IN0b) of pulse width adjuster circuit 308. The differential outputs of delay circuit 302 are respectively coupled to differential input (IN1 and IN1b) of circuit 308. Also, the differential outputs of delay circuit 303 are respectively coupled to the differential input (IN2 and IN2b) of circuit 308. Finally, first and second outputs of level shift circuit 306 are respectively coupled to differential inputs IN3 and IN3b of circuit 308.

Pulse width adjuster circuit 308 also includes first and second differential select inputs which are responsive to first and second differential select signals S0, S0b, S1, S1b. Finally, pulse width adjuster circuit 308 includes outputs OUT and OUTb.

The circuit of FIG. 3 operates much like the circuit of FIG. 1, except it is being demonstrated with differential inputs and allows for more possibilities of pulse stretch choices. The select signals received by circuit 308 determine which input IN0, IN1, or IN2 control the rising edge of the signal appearing at output OUT. Input IN3 of circuit 308 guarantees that the signal appearing at input IN2 will always control when the signal appearing at output OUT goes low. The result is that the pulse width of the output signal appearing at output OUT can be adjusted with respect to incoming signal IN by either (i) the delay of delay circuit 303, (ii) the sum of delays of delay circuits 302 and 303, or (iii) no adjustment. Note that although only three adjustments are allowed by the circuit in FIG. 3, it is understood that the choice of adjustments (stretch amounts) can be increased by adding more delay circuits and select inputs. Moreover, level shifter 306 is included to show that the input level of the lower level gates in circuit 308 require different high and low levels than the upper level inputs. This level shifter may be included in delay circuit 304.

Figure 4:
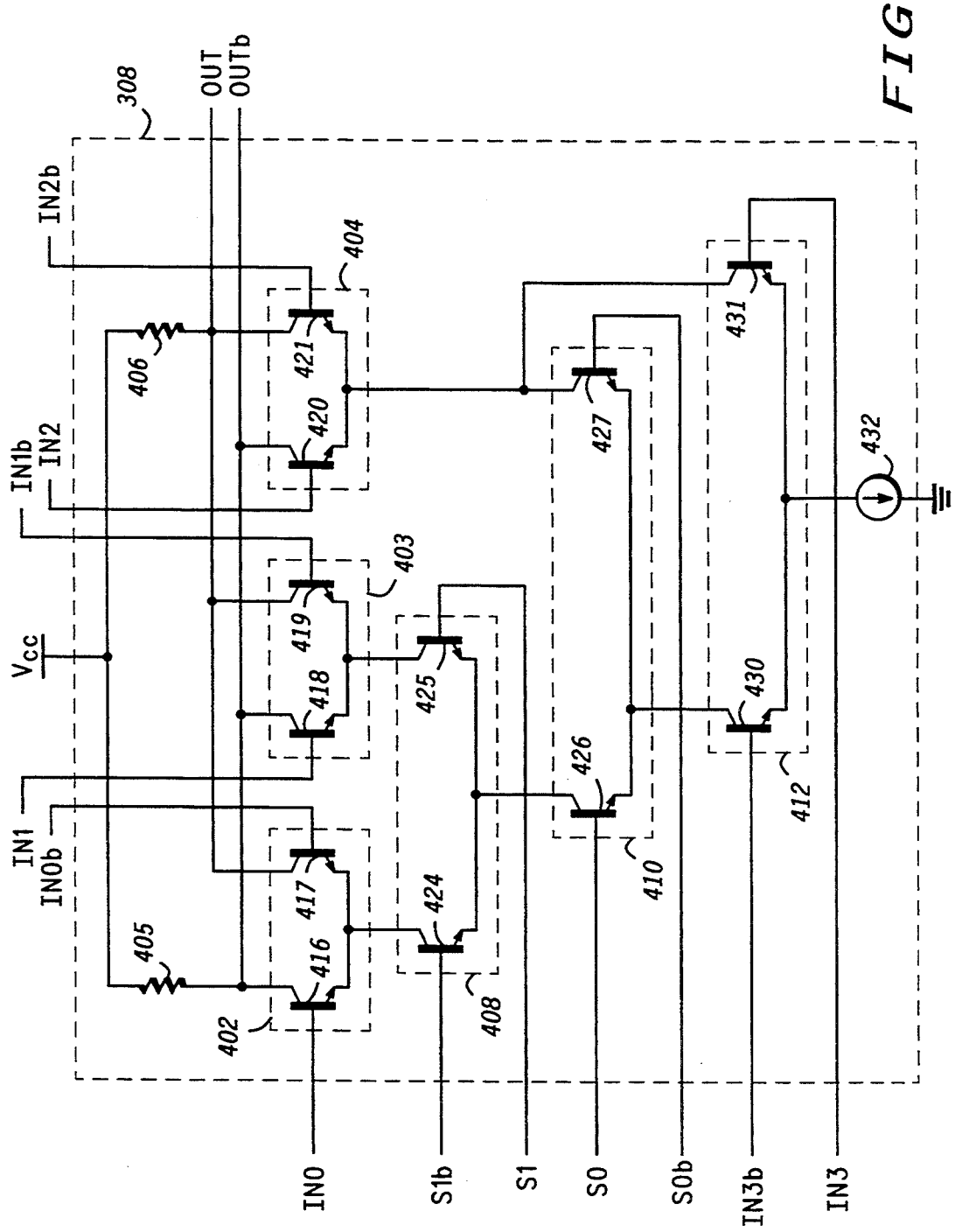
FIG. 4 is a detailed schematic diagram illustrating a pulse width adjuster circuit of FIG. 3.

Referring to FIG. 4, there is illustrated a detailed schematic diagram of pulse width adjuster circuit 308 of FIG. 3. Pulse width adjuster circuit 308 includes a first level of switches as represented by switches 402 through 404 for switching current through load resistors 405 and 406. Circuit 308 also includes a second level switch responsive to differential select signal S1 and S1b for alternately switching current through switches 402 and 403.

Circuit 308 also includes a third level switch 410 responsive to differential signal S0 and S0b for alternately switching current through switch 408 and switch 404.

Also, circuit 308 includes a fourth level switch 412 responsive to differential signal IN3 and IN3b for alternately switching current through switch 410 and switch 404.

Switch 402 includes emitter coupled transistors 416 and 417 having their bases respectively coupled to receive differential signals IN0 and IN0b the collector of transistor 416 is coupled through load resistor 405 to a supply voltage terminal at which the operating potential VCC is applied. The collector of transistor 417 is coupled through load resistor 406 to receive operating potential VCC. Moreover, the collectors of transistors 417 and 416 are respectively coupled to outputs OUT and OUTb.

Switch 403 includes emitter coupled transistors 418 and 419 having their bases respectively coupled to receive differential signals IN1 and IN1b. The collectors of transistors 418 and 419 are respectively coupled to the collectors of transistors 416 and 417.

Switch 404 includes emitter coupled transistors 420 and 421 having their bases respectively coupled to receive differential signal IN2 and IN2b. The collectors of transistors 420 and 421 are respectively coupled to the collectors of transistors 416 and 417.

Switch 408 includes emitter coupled transistors 424 and 425 having their bases respectively coupled to receive differential signals S1b and S1. The collector of transistor 424 is coupled to the common emitters of transistors 416 and 417 while the collector of transistor 425 is coupled to the common emitters of transistors 418 and 419.

Switch 410 includes emitter coupled transistors 426 and 427 having their bases respectively coupled to differential inputs S0 and S0b. The collector of transistor 426 is coupled to the common emitters of transistors 424 and 425 while the collector of transistor 427 is coupled to the common emitters of transistors 420 and 421.

Switch 412 includes emitter coupled transistors 430 and 431 having their bases respectively coupled to differential inputs IN3b and IN3. The collector of transistor 430 is coupled to the common emitters of transistors 426 and 427 while the collector of transistor 431 is coupled to the common emitters of transistors 420 and 421. The common emitters of transistors 430 and 431 are coupled through current source 432 and return to ground reference.

Referring to FIG. 5, there is illustrated a graphical diagram of various signals which help explain the detailed operation of circuit 308 which is shown as a block in FIG. 3 and shown in detail in FIG. 4. In particular, FIG. 5 shows signals appearing at inputs INT0, IN1, IN2, and IN3 of pulse width adjuster circuit 308 and the output with IN0 and IN1 selected. For simplicity only the true wave forms are shown. The inverting inputs are understood to be in the opposite logic state.

In operation, the signals appearing at the inputs of switch 412 determine whether switch 404 controls the signals appearing at the outputs (OUT, OUTb), or whether the signals appearing at the select inputs (S0, S0b, S1, and S1b) controls the signals appearing at the outputs wherein the signals appearing at the select inputs (S0, S0b, S1, and S1b) determine which first level switch (402, 403, or 404) controls the signals appearing at the outputs.

When the signals appearing at all inputs (IN3, IN2, IN1) are at a logic low state, transistor 430 of switch 412 is conducting current, enabling the select inputs to choose whether switch 402, 403, or 404 controls the output. For example, if the signals appearing at the S0 and S1b inputs are a logic high, then switch 402 is selected and the signal appearing at output OUT will go high when IN0 goes high. Three delay times later, IN3 goes high, making transistor 431 the current carrying device of switch 412.

When transistor 4311 is conducting current, switch 404 controls the outputs regardless of the select inputs. Since switch 404 is now in control of the outputs, OUT will go low when IN2 goes low. Three delays later IN3 goes low again, and transistor 430 conducts current again. This allows IN0 to control the rising edge again for the next cycle.

It is important to note that the amount of stretch can be controlled by selecting which input controls the rising edge. For example, when IN1 is selected, the output goes high when IN1 goes high, and goes low when IN2 goes low. However, when IN2 is selected, the output goes high when IN2 goes high, and goes low when IN2 goes low. The top level of gates always controls the switching of the outputs, so the timing is very precise. This method of pulse stretching can be expanded to any number of stretch increments with the proper selection of logic and delayed input signals.

By now it should be apparent that a novel circuit and method for adjusting the pulse of an input signal has been provided. The present invention provides an output signal whose pulse width may be adjusted with respect to the pulse width of an incoming input signal. In particular, a plurality of signals is generated in response to the input signal. One of the plurality of signals is selected for controlling when the output signal transitions from a first logic state to a second logic state, and one of the plurality of signals is selected for controlling when the output signal transitions from a second logic state to a first logic state wherein the output signal has a pulse width being a function of the selection of the plurality of signals.

While the invention has been described in specific embodiments thereof, it is evident that many alterations, modifications and variations will be apparent to those skilled in the art. Further, it is intended to embrace all such alterations, modifications and variations in the appended claims.

I claim:

1. A method for adjusting a pulse width of an input signal, the method comprising the steps of:
    (a) receiving an input signal;
    (b) generating a plurality of signals in response to said input signal:
    (c) selecting one of said plurality of signals for controlling when an output signal transitions from a first logic state to a second logic state by using the one of said plurality of signals to enable a selection of a first set of said plurality of signals, and selecting one of said first set of said plurality of signals to control when said output signal transitions from said first logic state to said second logic state;
    (d) selecting one of said plurality of signals for controlling when said output signal transitions from the second logic state to the first logic state, said output signal having a pulse width being a function of said plurality of signals.

2. A circuit for adjusting a pulse width of an input signal, comprising:
    a plurality of serially coupled delay circuits for providing a plurality of delayed signals, wherein an input of a first one of said plurality of delay circuits is coupled for receiving the input signal; and
    a pulse width adjuster circuit responsive to at least one select signal and having a plurality of inputs coupled for receiving said plurality of delayed signals, said pulse width adjuster circuit providing an output signal whose pulse width is a function of said plurality of delayed signals and said at least one select signal, wherein said pulse width adjuster circuit includes:
    a first level of switching being responsive to first and second ones of said plurality of delayed signals for controlling the logic state of said output signal;
    a second level of switching coupled to said first level of switching for steering current through said first level of switching, said second level of switching responsive to said at least one select signal; and
    a third level of switching coupled to said first and second levels of switching for alternately steering current through said first and second levels of switching, said third level of switching responsive to a third one of said plurality of delayed signals.

3. A circuit for adjusting a pulse width of an input signal, comprising:
    a plurality of serially coupled delay circuits for providing a plurality of delayed signals, wherein an input of a first one of said plurality of delay circuits is coupled for receiving the input signal;
    a level shift circuit having an input responsive to a delayed signal of a last one of said plurality of serially coupled delay circuits, said level shift circuit providing a level shift signal; and
    a pulse width adjuster circuit responsive to a plurality of select signals and having a plurality of inputs coupled for receiving said plurality of delayed signals and said level shift signal, said pulse width adjuster circuit providing an output signal whose pulse width is a function of said plurality of delayed signals and said plurality of select signals.

4. The circuit according to claims 3 wherein said pulse width adjuster circuit includes:
    an upper level of switching responsive to a first portion of said plurality of delayed signals for controlling a logic state of said output signal; at least one intermediate level of switching coupled to said first level of switching for steering current through said first switching level, said at least one level of intermediate switching responsive to said plurality of select signals; and
    a lower level of switching coupled to said at least one intermediate level of switching for alternately steering through said upper or said intermediate level of switching, said lower level of switching responsive to a last one of said plurality of delayed signals.

* * * * *